United States Patent [19]

Brodsky et al.

[11] Patent Number: 5,086,016
[45] Date of Patent: Feb. 4, 1992

[54] METHOD OF MAKING SEMICONDUCTOR DEVICE CONTACT INCLUDING TRANSITION METAL-COMPOUND DOPANT SOURCE

[75] Inventors: Stephen B. Brodsky, Millwood; Rajiv V. Joshi, Yorktown Heights; John S. Lechaton, Wappingers Falls, all of N.Y.; James G. Ryan, Essex Junction, Vt.; Dominic J. Schepis, Wappingers Falls, N.Y.

[73] Assignee: International Business Machines Corporation, Armonk, N.Y.

[21] Appl. No.: 606,632

[22] Filed: Oct. 31, 1990

[51] Int. Cl.$^5$ ................. H01L 21/225; H01L 21/283
[52] U.S. Cl. ........................ 437/190; 437/31; 437/160; 437/192; 148/DIG. 34; 148/DIG. 35; 357/67
[58] Field of Search ............... 437/190, 160, 161, 162, 437/163, 164, 189, 168, 169, 31, 192; 357/67, 71; 148/DIG. 34, DIG. 35

[56] References Cited

U.S. PATENT DOCUMENTS

| | | | |
|---|---|---|---|
| 4,319,932 | 3/1982 | Jambotkar | 148/1.5 |
| 4,481,046 | 11/1984 | Bouldin et al. | 148/188 |
| 4,483,726 | 11/1984 | Isaac et al. | 437/162 |
| 4,490,193 | 12/1984 | Ishaq et al. | 148/188 |
| 4,526,826 | 7/1985 | Ten Eyck et al. | 437/168 |
| 4,586,968 | 5/1986 | Coello-Vera | 437/162 |
| 4,734,386 | 3/1988 | Kubota et al. | 437/160 |
| 4,800,175 | 1/1989 | Rapp | 437/160 |
| 4,884,123 | 11/1989 | Dixit et al. | 437/192 |
| 4,920,071 | 4/1990 | Thomas | 437/188 |
| 4,920,073 | 4/1990 | Wei et al. | 437/200 |
| 4,976,839 | 12/1990 | Inoue | 357/71 |

FOREIGN PATENT DOCUMENTS

82/03948 11/1982 World Int. Prop. O. .......... 357/71

OTHER PUBLICATIONS

IEDM 85, "VLSI Local Interconnect Level Using Titanium Nitride", by T. Tang et al., pp. 590–593.
IBM Technical Disclosure Bulletin, vol. 30, No. 5, Oct. 1987, "Method for Forming Shallow P+ Diffusions", by S. Roberts et al., p. 404.

*Primary Examiner*—Brian E. Hearn
*Assistant Examiner*—T. N. Quach
*Attorney, Agent, or Firm*—Jeffrey L. Brandt; Harold Huberfeld

[57] ABSTRACT

A contact is provided in a self-aligned manner to a doped region a semiconductor substrate by first forming a layer of a transition metal-boride compound over a selected region on the substrate. A layer of a transition metal-nitride compound is formed over the layer of transition metal-boride compound, and the structure is heated to drive dopant from the layer of transition metal-boride compound into the substrate. The transition metal-boride/transition metal nitride layers are patterned to leave a contact to the doped region.

5 Claims, 3 Drawing Sheets

METHOD OF MAKING SEMICONDUCTOR DEVICE CONTACT INCLUDING TRANSITION METAL-COMPOUND DOPANT SOURCE

The present invention relates generally to semiconductor devices and more particularly to the use of a transition metal-compound as a self-aligned diffusion source and electrical contact to a doped semiconductor region.

BACKGROUND OF THE INVENTION

Many semiconductor processing applications are known wherein it is desirable to outdiffuse a dopant, into a semiconductor substrate, from a dopant source which subsequently functions as a contact to the doped substrate region. In many current applications relating to the formation of high-performance transistors, doped polysilicon is used both as the dopant source and as an ohmic contact to the diffused region. See, for example, U.S. Pat. No. 4,319,932 to Jambotkar (assigned to the assignee of the present invention), wherein polysilicon is used both as a diffusion source and contact for the extrinsic base region of a vertical, bipolar transistor. Polysilicon, however, has the disadvantage of exhibiting a relatively high sheet resistance.

U.S. Pat. No. 4,490,193 to Ishaq et al., assigned to the assignee of the present invention, shows a method of making a diffusion into a semiconductor substrate, using a rare earth boride dopant source, wherein the rare earth boride material remains as an ohmic electrical contact to the doped region. U.S. Pat. No. 4,481,046 to Bouldin et al., also assigned to the assignee of the present invention, is similar to Ishaq et al. in that the latter teaches the use of a rare earth hexaboride material, containing a predetermined amount of silicon, for the same purposes. These rare earth boride/hexaboride materials suffer from the disadvantage of reacting with silicon at temperatures in the 1,000+°C. range. Such a reaction can damage the underlying silicon region or devices contained therein.

Tang, T., et al., "VLSI Local Interconnect Level Using Titanium Nitride," IEDM 85, 590-593 shows a method of forming L1 level interconnects using titanium nitride (TiN) formed incidentally to the fabrication of titanium silicide ($TiSi_2$). More specifically, the TiN, which is incidentally formed over oxide regions during the $TiSi_2$ process, is selectively masked and etched to form a first level interconnect material. The TiN does not function as a dopant source.

Roberts, S., et. al., "Method for Forming Shallow P+ Diffusions," IBM Technical Disclosure Bulletin, Vol. 30, No. 5, Oct. 1987, pg. 404, teaches the formation of shallow P+ diffusions in silicon using sputter-deposited titanium boride as a diffusion source. The titanium boride is subsequently removed.

U.S. Pat. No. 4,734,386 shows the use of chemical vapor-phase deposited boron nitride as a solid dopant source for diffusion doping of semiconductor substrates.

OBJECTS OF THE INVENTION

An object of the present invention is to provide a new and improved method and structure for both solid phase doping and providing an electrical contact to a thusly doped semiconductor region.

Another object of the present invention is to provide such a dopant source/contact having low electrical resistance.

Yet another object of the present invention is to provide such a dopant source/contact having etch characteristics different from silicon so that the dopant source/contact can be etched selectively to silicon.

A further object of the present invention is to provide such a dopant source/contact which is compatible with associated transistor structures.

Yet a further object of the present invention is to provide such a dopant source/contact which does not react with silicon at conventional semiconductor processing temperatures.

SUMMARY OF THE INVENTION

In accordance with the present invention, there is provided a new and improved method of forming a self-aligned contact to a doped region on a semiconductor substrate, comprising the steps of: providing a substrate of semiconductor material; forming a first layer of a transition metal-boride compound over at least one selected portion of the substrate; forming a second layer of a transition metal-nitride compound over the first layer; and heating to drive dopant from the first layer into the substrate.

In accordance with another aspect of the present invention, there is provided an electrical contact to a doped region of a semiconductor substrate, comprising: a first layer of a transition metal-boride compound over at least one selected portion of the substrate; a second layer of a transition metal-nitride compound over the first layer; and a region of P type dopant in the substrate underneath the first layer.

BRIEF DESCRIPTION OF THE DRAWING FIGURES

These and other objects, features, and advantages of the present invention will become apparent through a consideration of the following detailed description of the invention when read in conjunction with the drawings Figures, in which.

DETAILED DESCRIPTION OF THE INVENTION

Figure 1A:
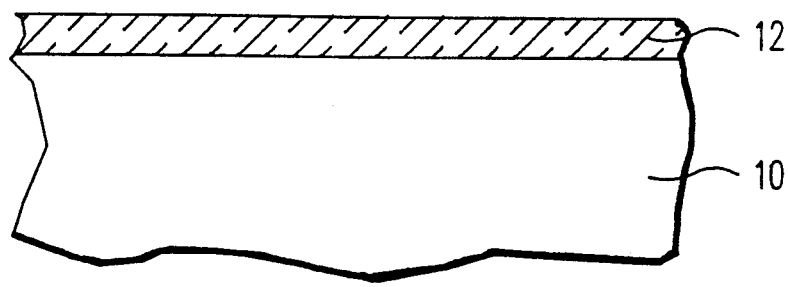
FIGS. 1A-1C are cross-sectional views showing a method of forming a doped semiconductor region and self-aligned electrical contact in accordance with the present invention.

Referring now to the drawing Figures, FIG. 1A shows a region 10 of semiconductor material, for example silicon, silicon-germanium, or germanium. Region 10 can be doped to either N or P type conductivity, and has a concentration in the range of − to +. As used herein, "N" and "P" refer to conductivity types, while "−" and "+" are used as appropriate to designate relative doping concentrations.

A layer 12 of an insulating material, for example silicon dioxide ($SiO_2$) or silicon nitride ($Si_3N_4$), is disposed on the upper surface of semiconductor region 10. Insulating layer 12 can be formed, for example by a conventional process of thermal oxidation (to form an oxide) or chemical vapor deposition (CVD—to form an oxide or a nitride).

Figure 1B:
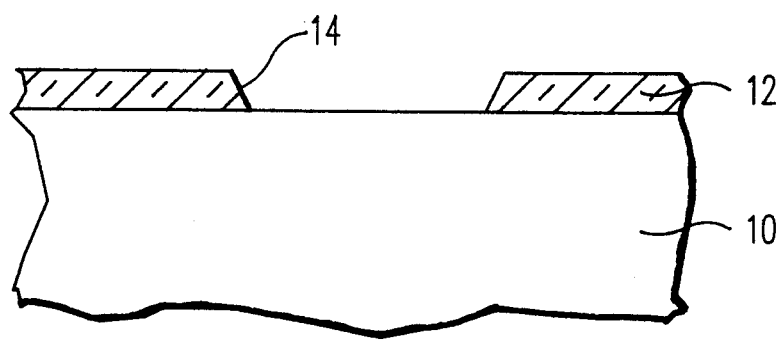

Referring now to FIG. 1B, an aperture 14 is formed in layer 12, exposing a portion of the surface of region 10. Aperture 14 can be formed by reactive ion etching (RIE), using conventional photolithographic masking, and an etchant/plasma appropriate to etch the insulating material used to form layer 12.

Figure 1C:
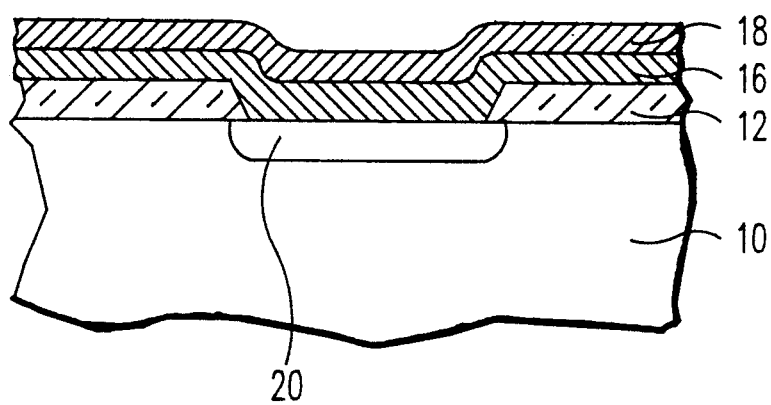

Referring now to FIG. 1C, a first layer 16 of a transition metal-boride compound is formed conformally over the surface of the device, including the surface of region 10 exposed within aperture 14. As used herein, the term "transition metal" refers to those metals in groups 1B–7B, and 8 of the Periodic Table. However, the invention is preferably practiced with those metals in the 3B–6B groups of the Periodic Table. The metals in these latter groups are desirable for their ability to form selected, low resistivity compounds of the types described below.

Layer 16, comprising $TiB_{2.x}$ (where x is an integer and $0<x<10$), is formed to a thickness of about 20–40 nanometers (nm). Layer 16 can be formed, for example, by sputtering, co-sputtering, or co-evaporation. Co-sputtering, for example, would comprise the use of titanium and boron targets.

Still with reference to FIG. 1C, a layer 18 of a transition metal-nitride is formed conformally over the upper surface of layer 16. For purposes of illustration, and without limitation, layer 18 will also be described with respect to the use of the transition metal titanium.

Layer 18, formed to a thickness of about 50 nm, can be formed by processes similar to those used to form layer 16: i.e. sputtering, co-sputtering, or co-evaporation.

Subsequent to the formation of layer 18, the device is subjected to a thermal cycle, for example a 950° C.–1,000° C. anneal for 60 seconds. This thermal cycle functions to drive boron ions from $TiB_{2.x}$ layer 16 into semiconductor region 10, forming P doped region 20. Layers 16 and 18 can then be patterned (not shown), using conventional masking and etching processes, to leave registered portions overlying doped region 20 as a low resistance, ohmic contact to the doped region.

When practiced using the titanium compounds described above, the resulting $TiN/TiB_{2.x}$ contact structure has a sheet resistance substantially lower than that of highly doped polysilicon. The present invention thus provides a much thinner contact structure for a given sheet resistance. This results in a more planar topography for a subsequently completed semiconductor device. Another advantage of the present invention is the selective etchability of the contact structure relative to silicon. The $TiN/TiB_{2.x}$ structure is etchable in a wet etch using $NH_4OH + H_2O_2 + H_2O$ solution (for example in a 1:1:5 ratio) at approximately 100 Angstroms/minute, providing an etching process which is very highly selective to the contact structure over the underlying silicon.

FIGS. 2A–2D illustrate the fabrication of a vertical NPN bipolar transistor in accordance with the present invention.

Figure 2A:
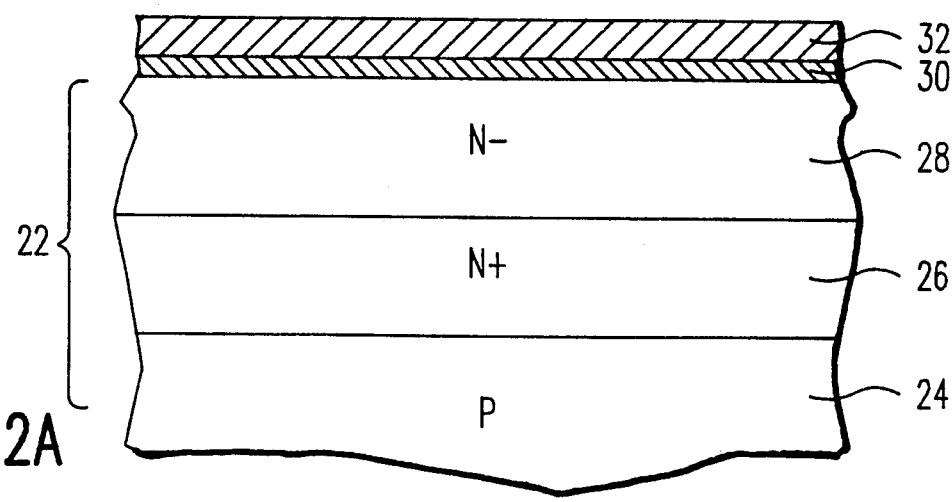
FIGS. 2A-2D are cross-sectional views showing a method of forming a vertical NPN bipolar transistor in accordance with the present invention.

Referring now to FIG. 2A, a multi-layer semiconductor substrate region 22 is shown comprising, for example, <100> crystallographic orientation silicon. Substrate region 22 includes a P type layer 24, an overlying N+ layer 26, and an overlying N− epitaxial layer 28. Substrate region 22 is formed, for example, by providing layer 24 from a conventional crystal pull so as to have the above-described crystallographic orientation, and a resistivity in the range of 1–20 ohm-cm. The surface of layer 26 is doped heavily N+, and layer 28 is grown epitaxially over layer 24 using a conventional CVD process. During this CVD process, the N+ dopant in layer 26 diffuses downward into layer 24, and upward into the epitaxial layer to provide the structure shown in FIG. 2A.

Substrate region 22 is electrically isolated from other, similar regions (not shown) formed on the larger substrate, for example through the use of isolation trenches or field oxide isolation in a manner well known in the art. The exact type of isolation does not constitute a part of the present invention.

Still with reference to FIG. 2A, a layer 30 of $TiB_{2.x}$ is formed over the surface of layer 28 to a thickness of about 25 nanometers (nm). A layer 32 of TiN is formed over layer 30 to a thickness of about 75 nm. Layers 30 and 32 are formed according to the processes described for the same type layers hereinabove.

Figure 2B:
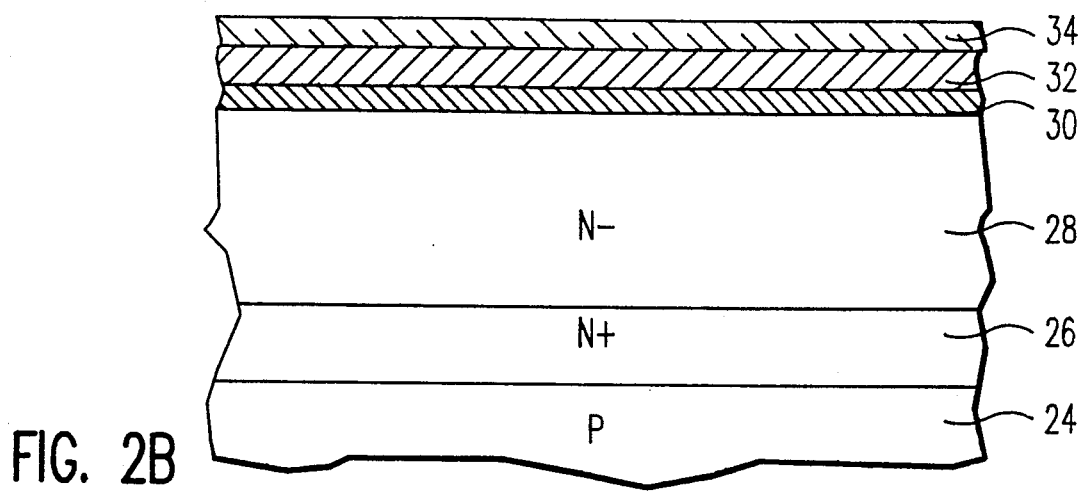

Referring now to FIG. 2B, a layer 34 of insulating material is formed over the upper surface of layer 32 to a thickness of about 100 nm. Layer 34 can comprise, for example an oxide, a nitride, or a nitride-over-oxide stack. Layer 34 is formed by a conventional process, such as thermal oxidation (for an oxide), or CVD (for an oxide or a nitride).

Figure 2C:
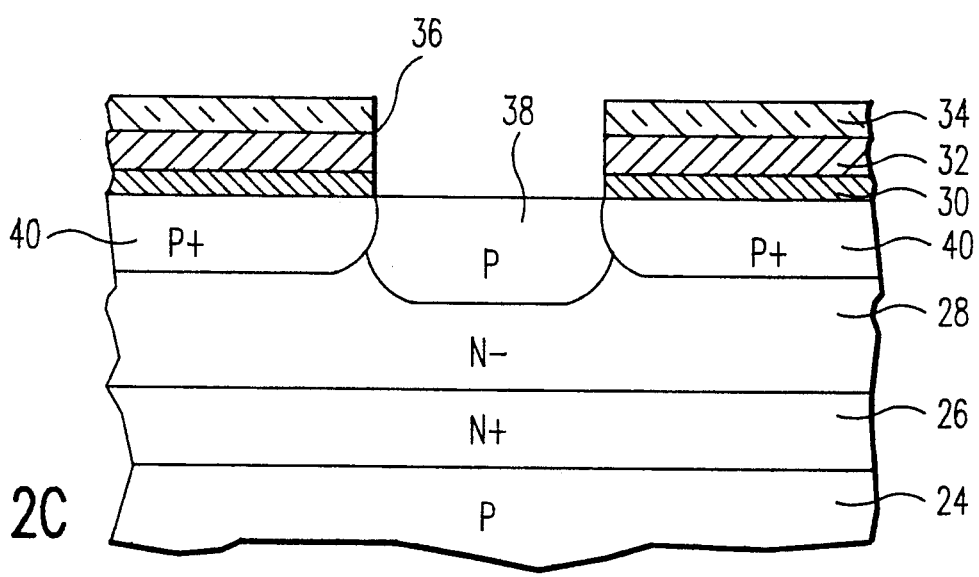

Referring now to FIG. 2C, conventional photolithographic masking (not shown) is used with an appropriate etching process to form an aperture 36 extending from the upper surface of layer 34 through layers 34, 32, and 30, consecutively, to expose the upper surface of layer 28. Appropriate etchants include a $CF_4$ or $CHF_3$ plasma RIE process for layer 34, and a $CF_4/O_2$ plasma RIE process (or an $NH_4OH + H_2O_2 + H_2O$ wet etch) for layers 32 and 30.

Still with reference to FIG. 2C, boron ions are implanted into the surface of layer 28 through aperture 36, using a conventional ion implant (I/I) process, to form P type region 38. The device is then subjected to a thermal cycle, for example at 900° C. for a period of 15 minutes in an $N_2$ environment, to drive dopant from layer 30 into layer 28, thereby forming P+ extrinsic base region 40. This thermal cycle further functions to cure any defects in the surface of layer 28 which might result from the I/I process used to form region 38. Alternatively, a separate anneal, subsequent to the drive-in anneal, could be used to cure any surface defects.

Figure 2D:
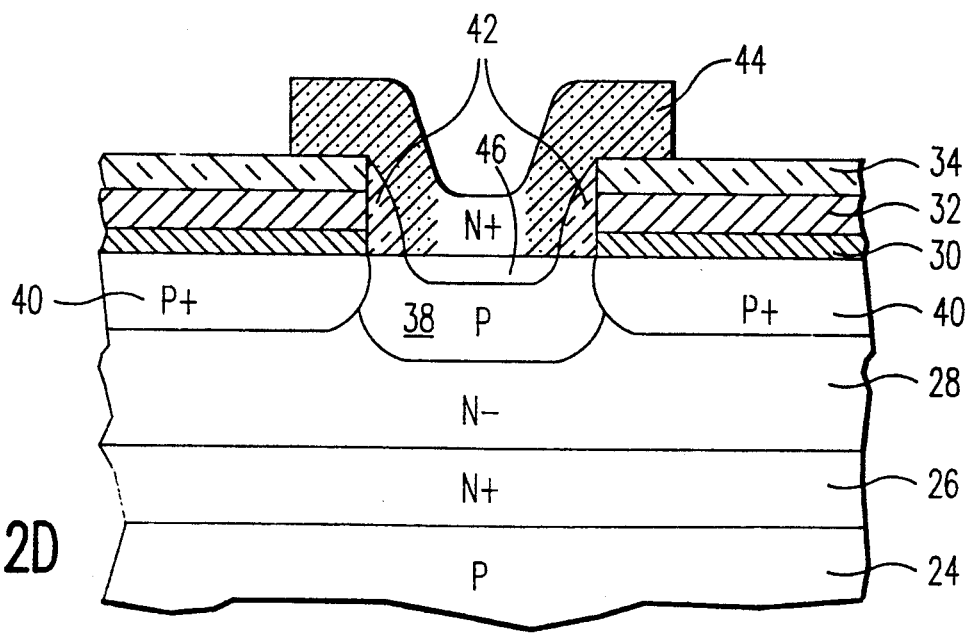

Referring now to FIG. 2D, insulating sidewalls 42 are formed on the exposed edges of layers 30, 32, 34 within aperture 36. Sidewalls 42 are formed, for example, of oxide, nitride, or a stack of such materials. Sidewalls 42 are formed by conformal deposition of the insulating material(s), followed by a RIE process to leave the sidewalls. A layer of polycrystalline silicon (polysilicon) is formed conformally over the device and implanted with ions to an N+ conductivity type. This polysilicon layer is then patterned so as to leave N+ polysilicon region 44 filling aperture 36. Polysilicon region 44 is formed using a conventional CVD process, to a thickness of about 200 nm.

Subsequent to the formation of polysilicon region 44, the device is subjected to another thermal cycle, for example at 880° C. degrees centigrade and for a duration of 20 min. As a result of this thermal cycle, dopant is driven from polysilicon region 44 into the surface of region 38, forming N type emitter region 46.

There is thus formed a vertical, NPN bipolar transistor, illustrated in FIG. 2D, having emitter region 46, intrinsic and extrinsic base regions 38 and 40, respectively, and collector and subcollector regions 28 and 26, respectively. In accordance with the present invention, extrinsic base region 40 is formed by out diffusion from the $TiB_{2-x}$/TiN stack 30, 32, the stack remaining as a self-aligned ohmic contact to the extrinsic base region. Metal contacts (not shown) can be provided in a conventional manner to TiN layer 32 and emitter polysilicon region 44. A conventional, highly-doped reachthrough region (not shown) and metal contact can be used to make an electrical connection to subcollector region 26.

Figure 3A:
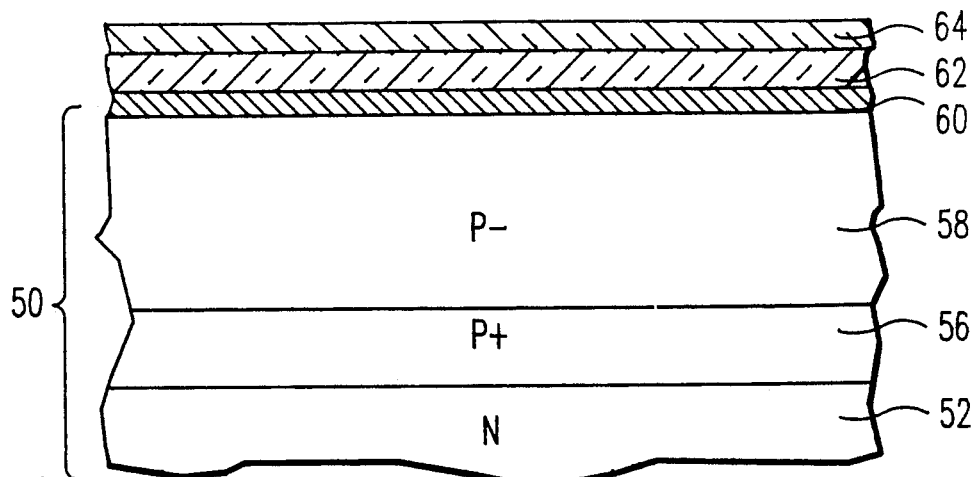
FIGS. 3A-3C are cross-sectional views showing a method of forming a vertical PNP bipolar transistor in accordance with the present invention.
Figure 3B:
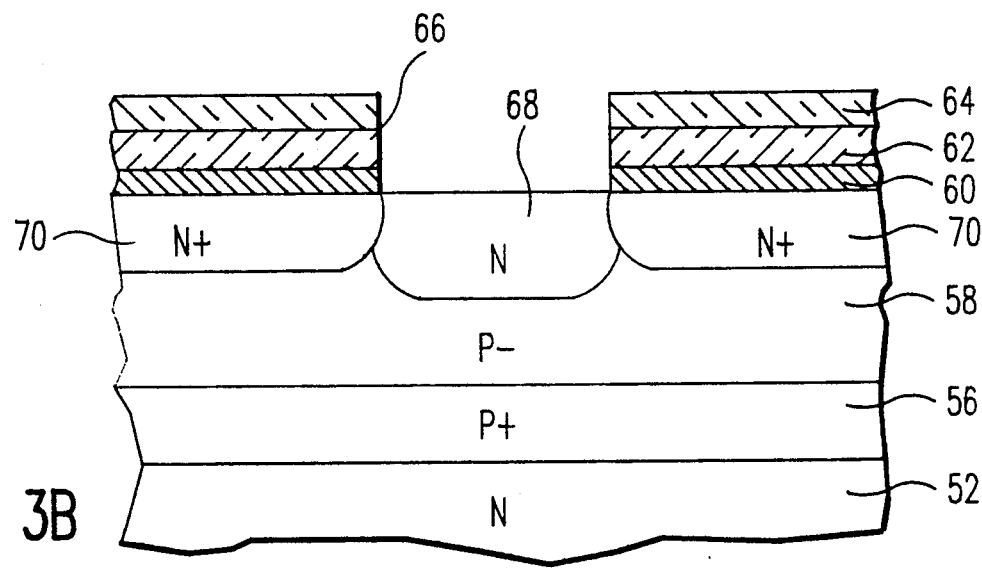
Figure 3C:
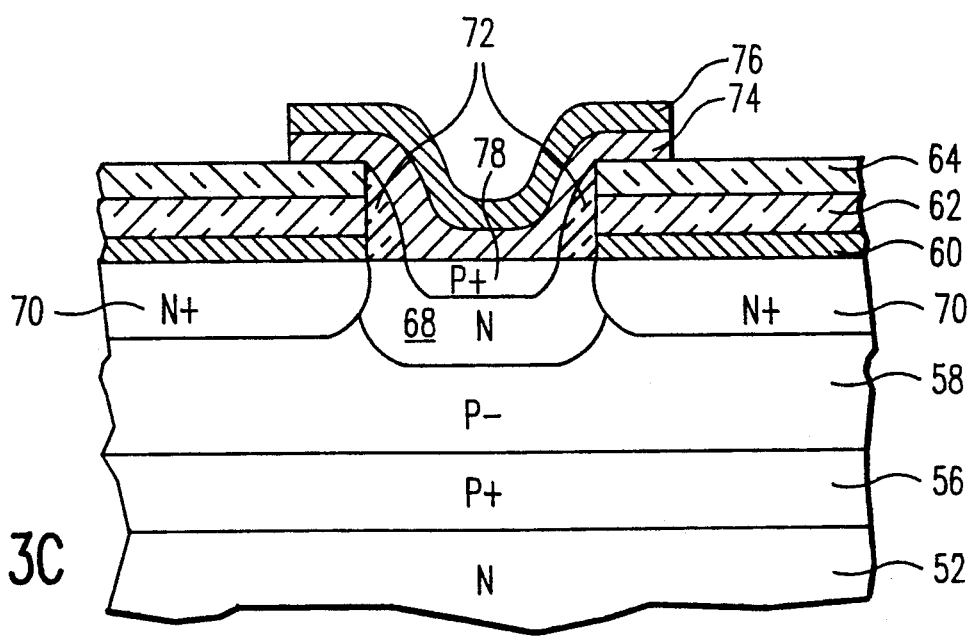

FIGS. 3A–3C illustrate the fabrication of a vertical PNP bipolar transistor in accordance with the present invention.

Referring now to FIG. 3A, a multi-layer semiconductor substrate region 50 is shown comprising, for example, <100> crystallographic orientation silicon. Substrate region 50 includes an N type layer 52, an overlying P+ layer 56, and an overlying P− epitaxial layer 58. Substrate region 50 is formed, for example, by providing layer 52 from a conventional crystal pull so as to have the above-described crystallographic orientation, and a sheet resistance in the range of 1–2 ohm-cm. The surface of layer 52 is doped heavily P+, and layer 56 is grown epitaxially over layer 52 using a conventional CVD process. During this CVD process, the P+ dopant in layer 56 diffuses downward into layer 52, and upward into the epitaxial layer to provide the structure shown in FIG. 3A.

Substrate region 50 is electrically isolated from other, similar regions (not shown) formed on the larger substrate, for example through the use of isolation trenches or field oxide isolation. The exact type of isolation does not constitute a part of the present invention.

Still with reference to FIG. 3A, a layer 60 of N+ polysilicon is formed over the upper surface of layer 58 to a thickness of about 250 nm. Polysilicon layer 60 is formed by a conventional CVD process, followed by I/I to obtain the N+ conductivity. A layer 62 of oxide is formed over layer 60 to a thickness of about 100 nm. Layer 62 can be formed by CVD or thermal oxidation. A layer 64 of nitride is formed over layer 62, by a conventional CVD process, to a thickness of about 100 nm.

Referring now to FIG. 3B, conventional photolithographic masking (not shown) is used to define the boundary of an aperture 66, the aperture extending from the upper surface of layer 64 consecutively downward through layers 64, 62, and 60. Aperture 66 thus exposes a portion of the upper surface of layer 58. Aperture 66 can be formed using a RIE process with a $CF_4$ plasma.

Subsequent to the formation of aperture 66, arsenic or phosphorous ions are implanted, using a conventional I/I process, into the exposed surface of layer 58 to form N intrinsic base region 68. The device is then subjected to a thermal cycle, for example at 900 degrees centigrade for a period of 30 min. This thermal cycle functions to drive dopant from layer 60 into the underlying portions of layer 58, forming N+ extrinsic base region 70. This same thermal anneal operates to cure any defects in the surface of layer 58 which might result from the ion implantation used to form intrinsic base region 68. Alternatively, a separate, subsequent anneal could be used to cure any such defects.

Referring now to FIG. 3C, an insulating sidewall 72 is formed over the exposed edges of layers 60, 62, and 64 within aperture 66. Sidewall 72 is formed by depositing a layer of insulating material, such as an oxide, a nitride, or a stack of these materials, conformally over the device. A RIE process is used to remove the horizontal portions of this insulating layer(s), leaving sidewall 72.

In accordance with the present invention, a layer 74 of $TiB_{2-x}$ is formed over the device, including region 68 within aperture 66, to a thickness of about 25 nm. A layer 76 of TiN is then formed over layer 74 to a thickness of about 75 nm. Layers 74 and 76 are formed by the processes of sputtering, co-sputtering, or co-evaporation in the manner described hereinabove.

The device is then subjected to a thermal cycle, for example at 975 degrees centigrade for 1 minute. This thermal cycle drives dopant from layer 74 into the underlying surface portion of region 68, whereby to form P+ emitter region 78. TiN/$TiB_{2-x}$ layers 76/74 are then patterned, using conventional photolithographic and etching processes, to provide a self-aligned, ohmic contact to emitter region 78.

There is thus formed a vertical, PNP bipolar transistor, illustrated in FIG. 3C, having emitter region 78, intrinsic and extrinsic base regions 68 and 70, respectively, and collector and subcollector regions 58 and 56, respectively. In accordance with the present invention, emitter region 78 is formed by out diffusion from the $TiB_{2-x}$/TiN stack 74, 76, the stack remaining as a self-aligned ohmic contact to the emitter region. Metal contacts (not shown) can be provided in a conventional manner to TiN layer 76 and extrinsic base polysilicon contact region 60. A conventional, highly-doped reachthrough region (not shown) and metal contact can be used to make an electrical connection to subcollector region 56. An advantage of the present invention is that of the TiN functioning as a barrier to aluminum penetration, making the present invention particularly suitable for use with aluminum metallurgy.

Methods and structures utilizing a transition metal-boride/transition metal-nitride stack have thus been provided for fabricating doped semiconductor regions and self-aligned electrical contacts thereto. The methods are generally compatible with conventional semiconductor processing techniques and will not result in harmful reactions with silicon. The resulting structures yield low topography, low resistivity electrical contacts. The present invention has been shown to have special applicability to the formation of NPN and PNP vertical, bipolar transistors. The invention is further applicable to the formation of such transistors for very large scale integrated circuits (VLSIC).

While the invention has been shown and described with respect to preferred embodiments, it is not thus limited. Numerous modifications, changes, and improvements within the scope of the invention will occur to those skilled in the art.

What is claimed is:

1. A method of forming a self-aligned contact to a doped region on a semiconductor substrate, comprising the steps of:

providing a substrate of semiconductor material;

forming a first layer of a transition metal-boride compound over at least one selected portion of said substrate;

forming a second layer of a transition metal-nitride compound over said first layer;

heating to drive dopant from said first layer into said substrate; and removing portions of said first and second layers to leave overlying portions of said first and second layers as a contact to the doped region.

2. A method in accordance with claim 1 wherein said transition metals are selected from the metals in groups 3B, 4B, 5B, or 6B of the Periodic Table.

3. A method in accordance with claim 1 wherein said transition metals comprise titanium and said transition metal-boride comprises $TiB_{2-x}$, with $0<x<10$ wherein x is an integer.

4. A method in accordance with claim 1 wherein said first and second layers comprise an electrical contact to a base region of a NPN type transistor, the dopant diffused into said substrate from said first layer comprising at least a portion of the base region of said NPN transistor.

5. A method in accordance with claim 1 wherein said first and second layers comprise an electrical contact to an emitter region of a PNP type transistor, the dopant diffused into said substrate from said first layer comprising at least a portion of the emitter region of said PNP transistor.

* * * * *